(12) United States Patent
Tsujino

(10) Patent No.: US 6,744,691 B2
(45) Date of Patent: Jun. 1, 2004

(54) SEMICONDUCTOR MEMORY MODULE

(75) Inventor: Mitsunori Tsujino, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/337,734

(22) Filed: Jan. 8, 2003

(65) Prior Publication Data

US 2003/0213988 A1 Nov. 20, 2003

(30) Foreign Application Priority Data

May 14, 2002 (JP) ........................................ 2002-138093
Sep. 10, 2002 (JP) ........................................ 2002-263837

(51) Int. Cl.$^7$ ................................................. G11C 8/00
(52) U.S. Cl. ............................ 365/230.03; 365/230.08; 365/200
(58) Field of Search ...................... 365/230.03, 230.08, 365/200, 225.7, 203, 201

(56) References Cited

U.S. PATENT DOCUMENTS 5,815,456 A * 9/1998 Rao ...................... 365/230.03

FOREIGN PATENT DOCUMENTS

JP        P2000-30487 A        1/2000

* cited by examiner

*Primary Examiner*—David Lam
(74) *Attorney, Agent, or Firm*—McDermott, Will & Emery

(57) ABSTRACT

A first repair chip, wherein BANK 2 functions properly although BANKs 0, 1 and 3 have become defective, and a second repair chip, wherein BANKs 1, 2 and 3 function properly although BANK 0 has become defective, are mounted on a rear surface of a module substrate in order to substitute for the functions of BANK 2 of the first bare chip and of BANKs 1 and 2 of the second bare chip that have become defective on the front surface of the module substrate. Thereby, a semiconductor memory module is obtained that can be repaired by mounting chips that carry out functions substituting for those of defective banks while effectively utilizing the functions of other banks that are not defective.

7 Claims, 17 Drawing Sheets

FIG.15

COMMAND TRUTH TABLE

| COMMAND | MNEMONIC | CKE n-1 | CKE n | /CS | /RAS | /CAS | /WE | BA0,1 | A11,12 | A10 | A0-9 |
|---|---|---|---|---|---|---|---|---|---|---|---|
| (1) Deselect | DESEL | H | X | H | X | X | X | X | X | X | X |
| (2) No Operation | NOP | H | X | L | H | H | H | X | X | X | X |
| (3) Row Address Entry & Bank Activate | ACT | H | X | L | L | H | H | V | V | V | V |
| (4) Single Bank Precharge | PRE | H | X | L | L | H | L | V | X | L | X |
| (5) Precharge All Banks | PREA | H | X | L | L | H | L | X | X | H | X |
| (6) Column Address Entry & Write | WRITE | H | X | L | H | L | L | V | V | L | V |
| (7) Column Address Entry & Write with Auto-Precharge | WRITEA | H | X | L | H | L | L | V | V | H | V |
| (8) Column Address Entry & Read | READ | H | X | L | H | L | H | V | V | L | V |
| (9) Column Address Entry & Read with Auto-Precharge | READA | H | X | L | H | L | H | V | V | H | V |
| (10) Auto-Refresh | REFA | H | H | L | L | L | H | X | X | X | X |
| (11) Self-Refresh Entry | REFS | H | L | L | L | L | H | X | X | X | X |
| (12) Self-Refresh Exit | REFSX | L | H | H | X | X | X | X | X | X | X |
| | | L | H | L | H | H | H | X | X | X | X |
| (13) Mode Register Set | MRS | H | X | L | L | L | L | L | L | L | V*1 |

H=High Level, L=Low Level, V=Valid, X=Don't Care, n=CLK cycle number
NOTE:
1. A7-A9=0, A0-A6=Mode Address

SEMICONDUCTOR MEMORY MODULE

BACKGROUND OF THE INVENTION

1. Field of the Invention

The present invention relates to a semiconductor memory module wherein a semiconductor chip is mounted on a module substrate.

2. Description of the Background Art

A semiconductor memory device is, in many cases, utilized in a personal computer, a workstation or the like. In addition, in recent years the speed, degree of compactness and number of functions of personal computers have increased and, therefore, semiconductor memory devices have been required to further increase their memory capacity. In addition, the market has expanded so that a large number of low-cost memory devices are used. Therefore, further increase in the capacity of, and further reduction in costs of, semiconductor memory devices have become required.

The number of DRAMs (Dynamic Random Access Memory), from among the above described semiconductor memory devices, utilized in personal computers or the like has increased because it is advantageous from the point of view of cost per bit unit. Cost per bit unit can be reduced by increasing the diameter of wafers even in the case that the capacity is increased and, therefore, DRAMs are frequently utilized.

In a DRAM, however, cost of development, cost for high level institutions and the like have greatly increased together with the increase in the testing period of time and test costs accompanying the increase in capacity as well as the enhancement of microscopic processing technology so that whether or not those costs can be reduced has become a problem.

The bit configuration for the input to or output from a DRAM is conventionally 4 bits, 8 bits or 16 bits and, therefore, the variety in types of bit numbers is small so that one module is normally formed of a plurality of DRAMs for general utilization. Thus, a semiconductor memory device such as a DRAM is, in many cases, utilized in a module condition.

FIGS. 19 and 20 show an example of a conventional semiconductor memory module. The conventional semiconductor module has a structure, wherein single chips 117, in which bare chips 101, mounting islands 104, bonding wires 105 and lead frames 110 are molded into mold resin 108, are mounted on a module substrate 102, such as of an SOP (Small Outline Package) or a TSOP (Thin Small Outline Package) corresponding to a surface mounting technology wherein parts can be mounted on both sides of a printed circuit board.

In addition, development has progressed of a memory package having a basic tendency toward miniaturization and thinning together with enhancement of performance and of functions of a memory chip. Then, though an insertion system has been adopted for a memory package, in recent years the forms of packages have greatly changed such that a surface mounting system has started to be adopted.

At present, the surface mounting system has become the main trend in place of the insertion system and further miniaturization and lightening of a package are strongly required. Up to the present, simplification of design and increase in reliability, as well as reduction in cost, have been achieved by utilizing a semiconductor memory module.

In addition, in a conventional manufacturing process of a semiconductor memory module, in the case that a defective chip is discovered in a module test after the manufacture of a semiconductor memory module, testing and replacement of such a defective chip are carried out until such defect has been removed.

There is a problem wherein a great amount of time and effort are required for the replacement of a memory chip that has been detected as being defective according to the above described conventional manufacturing process of a semiconductor memory module. Furthermore, though there is a memory module in the form of a COB (Chip On Board) as a semiconductor memory module with which high density mounting can easily be carried out, there is a problem wherein a bare chip that has been detected as being defective cannot be repaired after bare chips have been sealed into a mold resin according to the conventional module in the form of a COB.

With respect to the above described problem, the inventors of the present application examined manufacture of a semiconductor memory module wherein bare chips other than the bare chips that have become defective from among the plurality of bare chips are effectively utilized by newly mounting a good chip even in the case that a chip defect is detected after the chips have been molded into a mold resin.

However, in the case that a new chip for repair is mounted so that a semiconductor module is repaired by mounting the repair chip that substitutes for the entirety of the functions of a bare chip, it is necessary to mount a new repair chip wherein all banks function properly on the module substrate by disabling the functions of the other banks that are not defective when only a portion of banks from among the plurality of banks formed inside of the bare chip is detected as being defective. According to such a repair method, the functions of the banks that are not defective from among the plurality of banks in a bare chip that has been detected as being defective cannot be effectively utilized.

SUMMARY OF THE INVENTION

An object of the present invention is to provide a semiconductor memory module wherein, in the case that a portion of banks from among a plurality of banks formed inside of a bare chip is detected as being defective, it is possible to effect repair by mounting a chip for repair that performs functions that substitute for the banks that have become defective while effectively utilizing the functions of the other banks that are not defective.

A semiconductor memory module of the present invention is a semiconductor memory module provided with a module substrate and semiconductor chips mounted on this module substrate.

In addition, the semiconductor chip includes a plurality of banks that can store data and an address input terminal into which a bank specification signal, which specifies in which bank from among the plurality of banks data is stored, is inputted.

In addition, the semiconductor memory module is provided inside or outside of a semiconductor chip with a specific bank activation/deactivation selection circuit that selects whether to make or not a specific bank a specific bank deactivation condition which data that is expected to be stored in the specific bank, which is specified by the bank specification signal, is not allowed to be inputted to the specific bank when the bank specification signal is inputted.

According to the above described configuration, which has a specific bank activation/deactivation selection circuit, a semiconductor chip can be put in a deactivated condition only in the case that a bank specification signal, which specifies a bank that has become defective, is inputted. Therefore, in the case that a substitute semiconductor chip that functions in place of the specific bank is further mounted, the semiconductor memory module can be repaired by effectively utilizing banks other than the specific bank from among the semiconductor chips. In addition, a semiconductor chip does not allow data expected to be stored in a specific bank to be inputted into the semiconductor chip under the deactivated condition and, therefore, the semiconductor chip can be prevented from unnecessarily consuming power.

In the semiconductor memory module, a substitute semiconductor chip may have a plurality of banks, which may include a bank that has become defective in banks other than the bank utilized in place of a specific bank from among the plurality of banks.

According to the above described configuration, when a semiconductor memory module is repaired, a semiconductor chip detected to include a defective bank can be used as a substitute semiconductor chip. Therefore, a semiconductor memory module can be repaired by effectively utilizing a semiconductor chip wherein a portion of the banks is defective, that is to say, a partially good product, which has conventionally been discarded.

The semiconductor memory module is provided with a specific command control enabling circuit that is a command input circuit into which a plurality of types of commands are inputted and that outputs a signal for controlling a semiconductor chip to be in a controlled condition specified by a particular type of command, regardless of whether or not the specific bank activation/deactivation circuit is in the deactivated condition for a specific bank in the case that a particular type of command from among the plurality of types of commands is inputted.

According to the above described configuration, in the case that a particular type of command is inputted to a semiconductor chip, the semiconductor chip is controlled to be put in the controlled condition based on this particular type of command, regardless of whether or not the specific bank activation/deactivation circuit is in the specific bank deactivating condition. As a result, control of other banks that are not defective can be prevented from causing problems due to the deactivated condition for a specific bank.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 15 is a command table for describing commands inputted into a bare chip or a repair chip of the semiconductor memory module of the present embodiment;

DESCRIPTION OF THE PREFERRED EMBODIMENTS

In the following, in reference to FIGS. 1 to 7, a semiconductor memory module of an embodiment of the present invention that is repairable after the bare chips are covered with a mold resin will be described.

In the semiconductor memory module of the present embodiment, in the case that a bare chip in the mold is detected as being defective, a repair chip that can be substituted for this bare chip is mounted on the module substrate, thereby the semiconductor module of the present embodiment is repaired.

Figure 1:
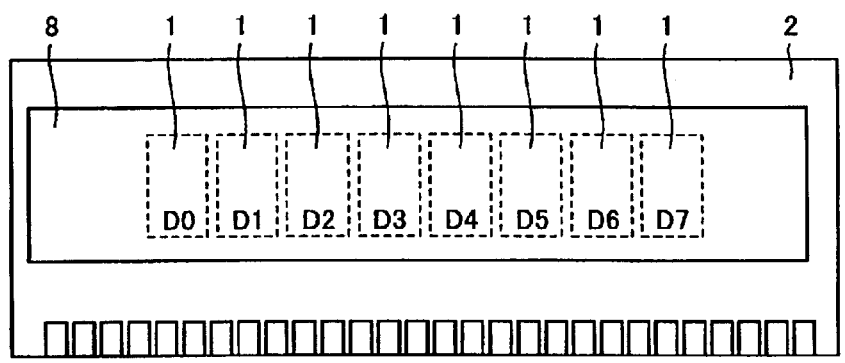
FIG. 1 is a view showing a condition wherein a plurality of bare chips mounted on a module substrate is integrally molded into a mold resin in a semiconductor module of an embodiment.

FIG. 1 shows the semiconductor memory module of the embodiment. As shown in FIG. 1, in the semiconductor memory module of the embodiment, a plurality of bare chips 1 is mounted directly on one of the main surfaces of a module substrate 2 and the plurality of bare chips 1 are integrally molded into a mold resin 8.

Figure 2:
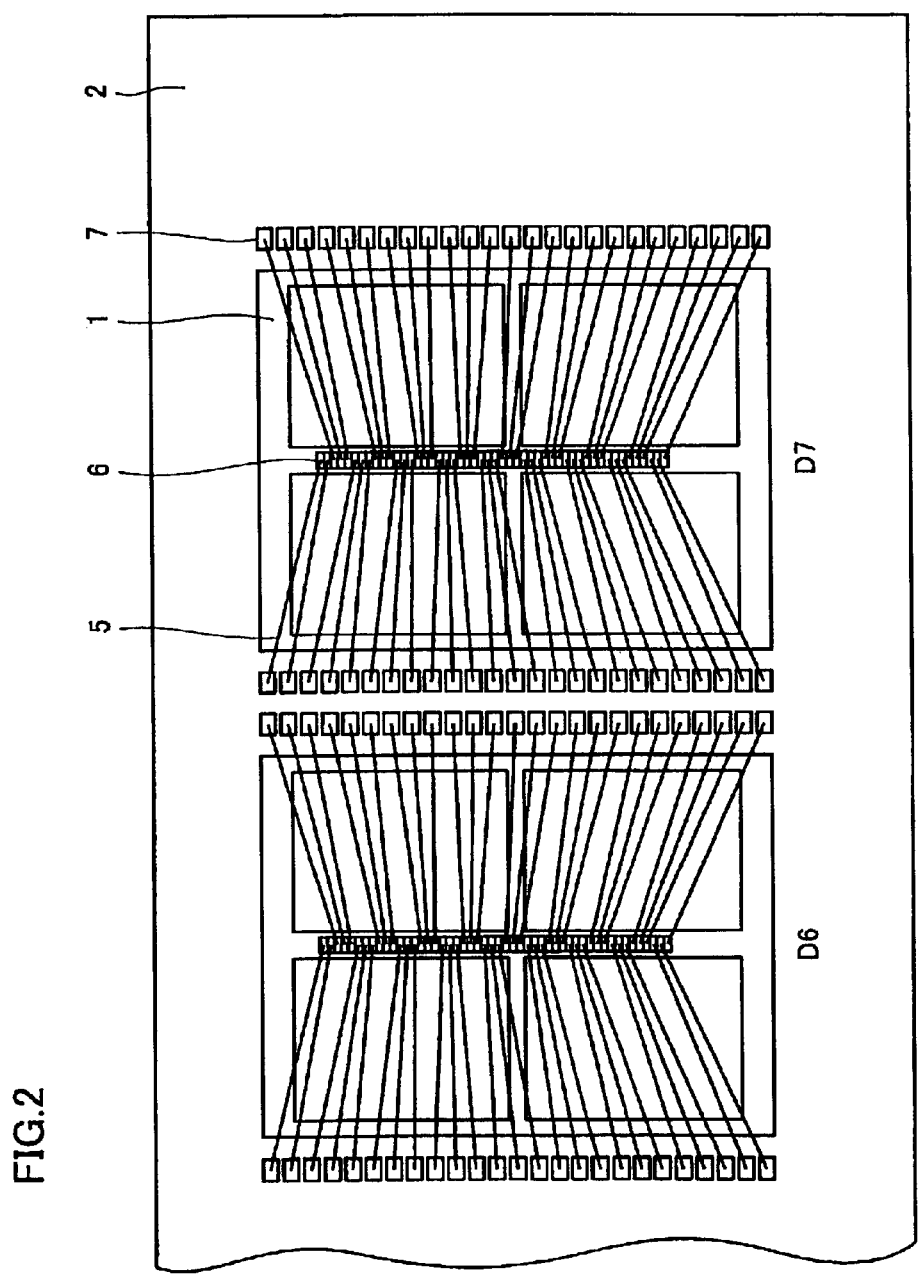
FIG. 2 is a view for describing bare chips mounted on a module substrate.

In addition, as shown in FIG. 2, bonding pads 6 provided on bare chips 1 and wiring pads 7 provided on module substrate 2 are connected by means of bonding wires 5.

Figure 3:
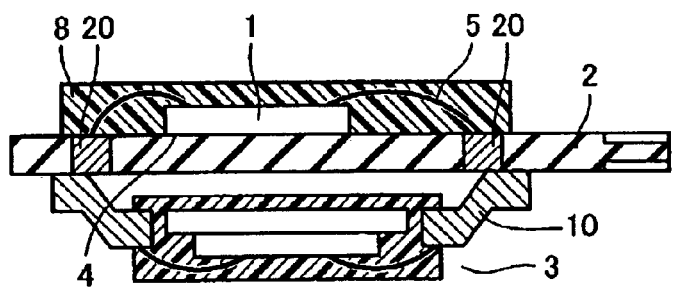
FIG. 3 is a view for describing a cross sectional structure of a bare chip and a repair chip mounted on a module substrate.

In addition, the semiconductor memory module of the embodiment has a structure wherein, in the case that any bare chip 1 from among the plurality of bare chips 1 is detected as being defective, as shown in FIG. 3, a repair chip 3 used in place of bare chip 1 can be mounted on the rear side of the main surface where the plurality of bare chips 1 is provided.

Here, though, as for the semiconductor memory module of the present embodiment, an example is shown wherein bare chips 1 are mounted on one of the surfaces of module substrate 2 while repair chips 3 are mounted on the other surface (rear surface), both bare chips and repair chips may be mounted on one of the surfaces, alone, of a module substrate, so that no chips are mounted on the other side, in the case that large module substrate 2 can be used.

In the semiconductor memory module of the present embodiment, a bare chip 1 mounted on the front surface of a module substrate 2 and a repair chip 3 used in place of this bare chip 1 and mounted on the rear surface of module substrate 2 utilize common electrical wires 20. In addition, in the case that repair chip 3 is mounted on the rear surface of module substrate 2, as shown in FIG. 3, electrical wires 20 are electrically connected to both a plurality of bare chips 1 mounted on the front surface and repair chips 3 mounted in a plurality of repair chip mounting regions, respectively, on the rear surface via through holes that penetrate module substrate 2.

In a manufacturing method for a semiconductor memory module of the present embodiment, as shown in FIG. 2, after a plurality of bare chips 1 is mounted on a module substrate 2, bonding pads 6 provided on bare chips 1 and wiring pads 7 provided on module substrate 2 are electrically connected by means of bonding wires 5. After that, as shown in FIG. 3, the plurality of bare chips 1 is integrally molded into a mold resin 8, thereby the semiconductor memory module is completed. In addition, the completed semiconductor memory module has a structure wherein a repair chip 3 having a single chip sealed in a mold can, if necessary, be mounted on the rear surface of module substrate 2.

Therefore, in the case that a specific bank is detected as being defective from among a plurality of banks of a specific bare chip 1, from among a plurality of bare chips 1, by means of a variety of tests, such as a system test after manufacture of the semiconductor module, a repair chip 3 is mounted on the rear surface of module substrate 2 so that repair chip 3 carries out functions substituting for the specific bank that has become defective in a specific bare chip 1, thereby it becomes possible to repair the semiconductor memory module.

Here, it is necessary to stop the operation of the specific bank of bare chip 1 that has been detected as being defective in order for repair chip 3 to carry out the functions substituting for the specific bank of the specific bare chip 1 that has been detected as being defective. Therefore, it becomes necessary in the semiconductor memory module of the present embodiment to control the switching between the activated condition wherein a specific bank of bare chip 1 functions and the deactivated condition wherein a specific bank of bare chip 1 does not function.

As a result, in the semiconductor memory module of the present embodiment, the activated condition and the deactivated condition of a specific bank of a specific bare chip 1 are switchable using the below described INB (Input buffer) circuit so that a specific bank of a specific bare chip 1 that has been detected as being defective is put in the deactivated condition, thereby a condition is obtained wherein it is possible for repair chip 3 to carry out the functions of the specific bank 1. In addition, repair chip 3 is formed so that the banks other than the bank that carries out the functions substituting for bare chip 1 can be put in the deactivated condition wherein the functions thereof are stopped through the functioning of the INB circuit.

Here, in the semiconductor memory module of the embodiment, a plurality of bare chips 1 are mounted on a module substrate 2 and is integrally molded into a mold resin 8 after bonding pads 6 of bare chips 1 and wiring pads 7 of module substrate 2 are electrically connected to each other. Therefore, the mounting area of the semiconductor memory module can be made small.

Figure 4:
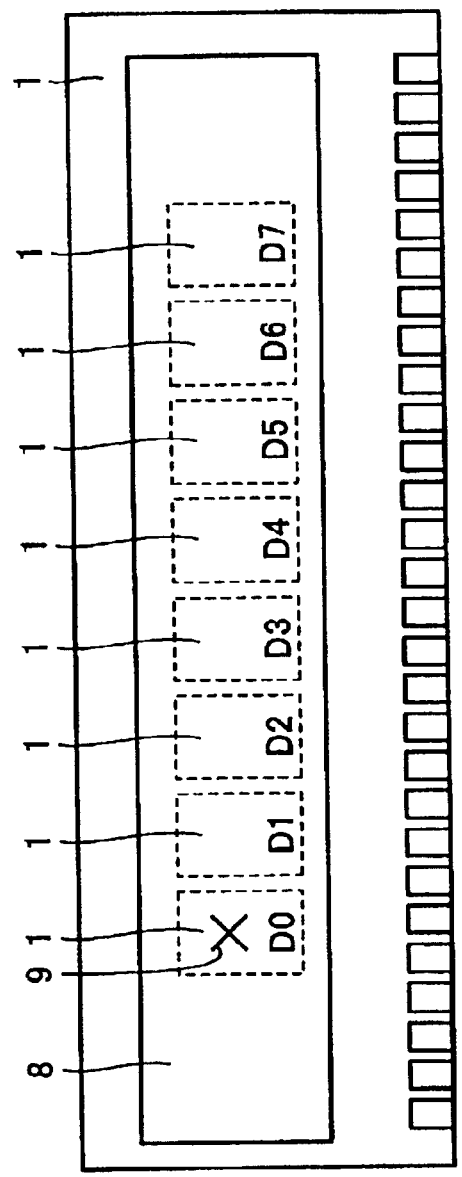
FIG. 4 is a view for describing that a one of the bare chips mounted on a module substrate has become defective.
Figure 5:
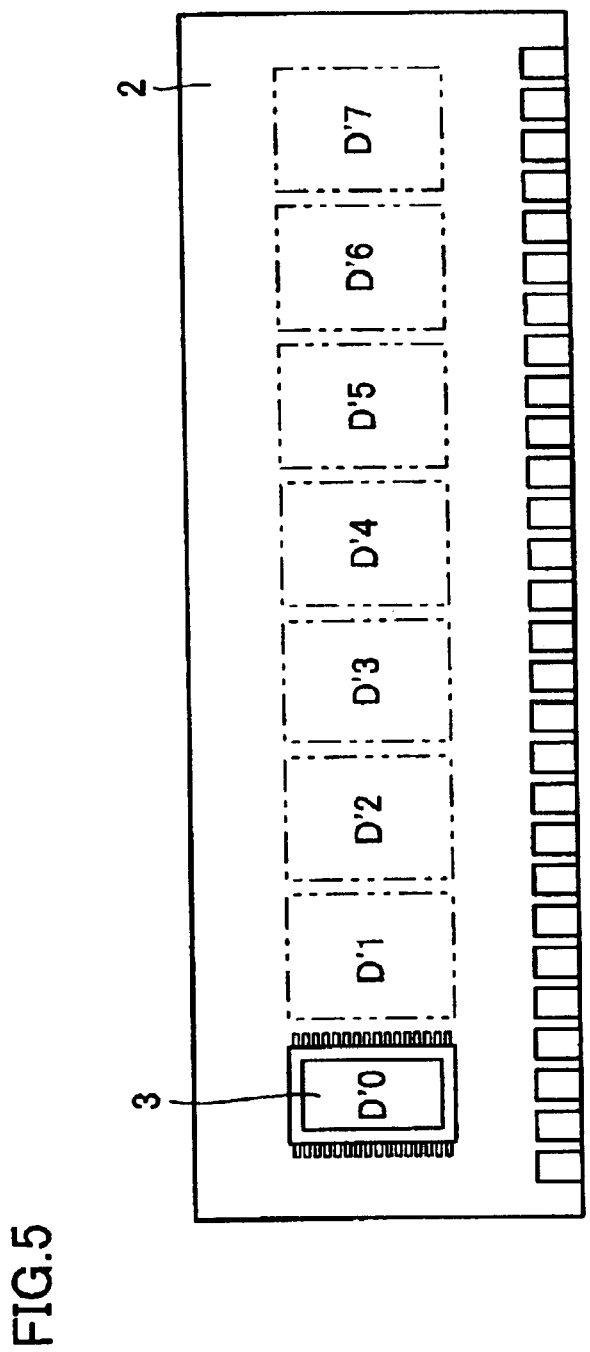
FIG. 5 is a view for describing that a semiconductor memory module is repaired by utilizing a good chip mounted on the rear surface of a module substrate.

FIGS. 4 and 5 show a configuration example of a module substrate after repair. As shown in FIGS. 4 and 5, bare chips 1 (D0 to D7) are mounted on the front surface of module substrate 2 while repair chip mounting regions for repair chip 3 (D'0 to D'7), mounted at the time of repair, are provided on the rear surface.

Figure 6:
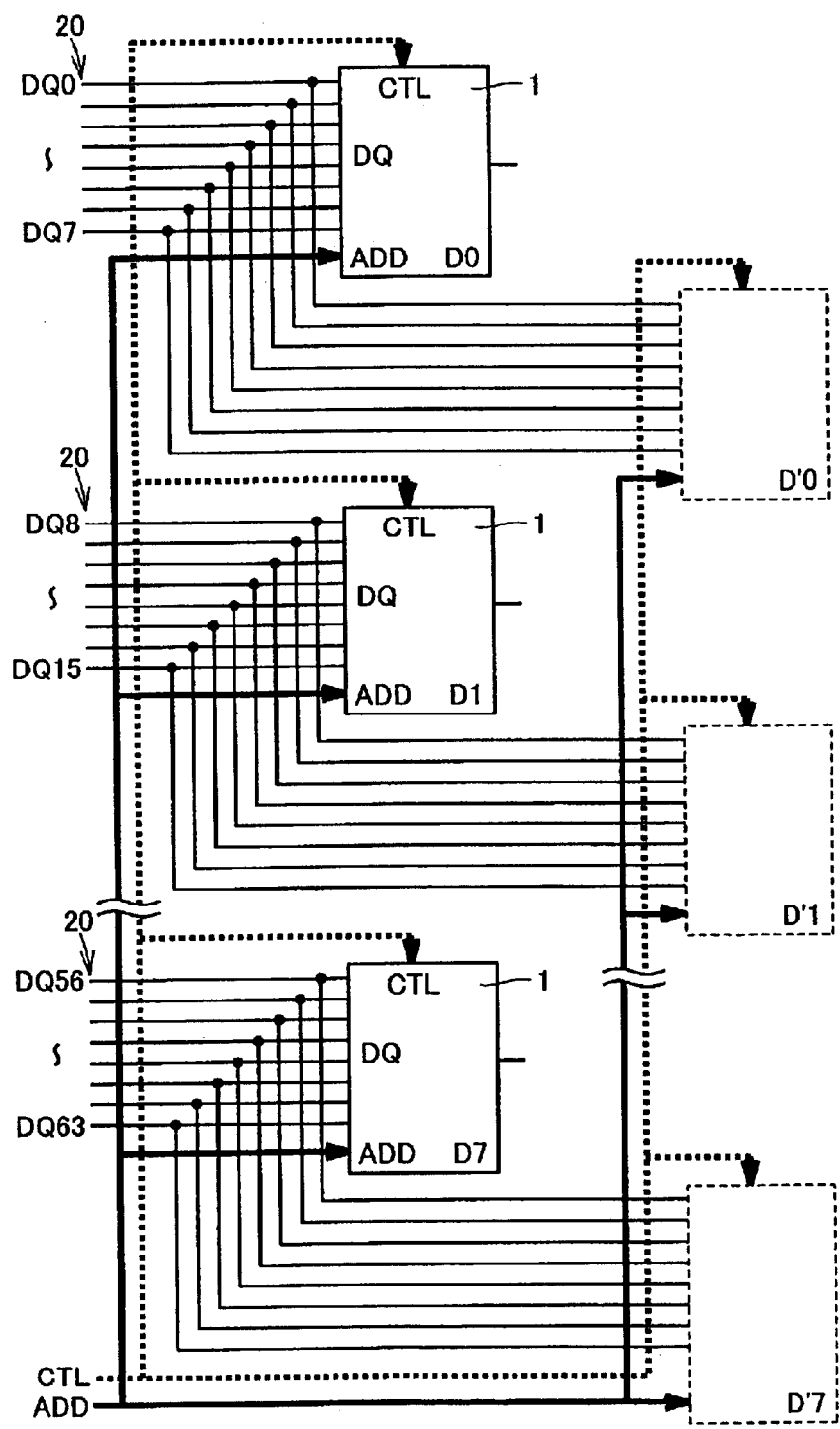
FIG. 6 is a diagram for describing a configuration of a module substrate before repair.
Figure 7:
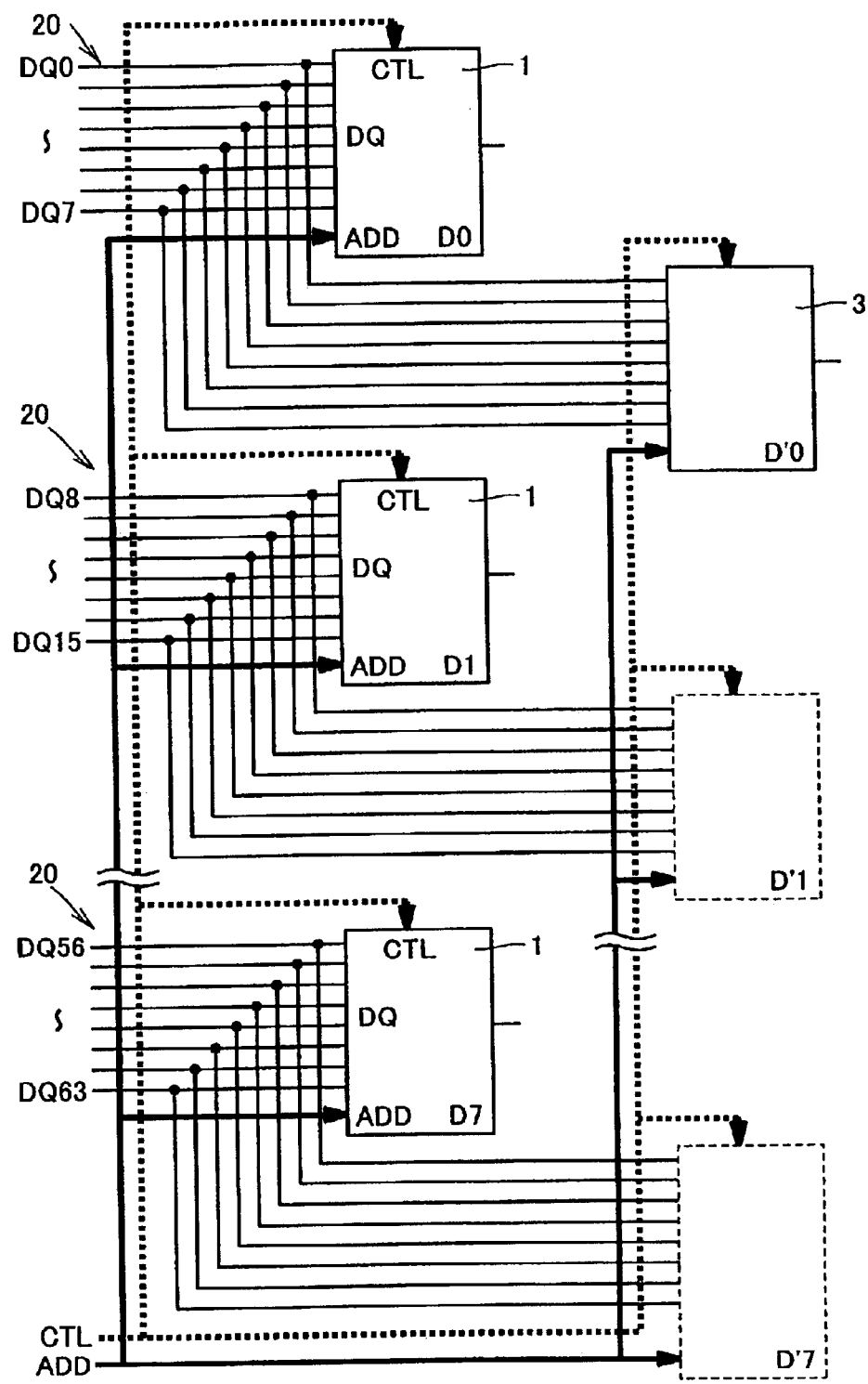
FIG. 7 is a diagram for describing a configuration of a module substrate after repair.

FIG. 6 shows a block diagram of the front and rear surfaces of module substrate 2 on which bare chips 1 (D0 to D7) are mounted before repair. FIG. 7 shows a block diagram of the front surface and of the rear surface of module substrate 2 on which single repair chips 3 in a mold (D'0 to D'7) utilized at the time of repair are mounted. Here, bare chips 1 (D0 to D7) and repair chips 3 (D'0 to D'7) utilize data input/output terminals DQ0 to DQ63 connected to common electrical wires 20, respectively. Here, data input/output terminals DQ0 to DQ63 are terminals connected to other circuits or memories for input/output of electrical signals between bare chips 1 (D0 to D7) or repair chips 3 (D'0 to D'7) and other circuits or memories.

Though the semiconductor memory module configuration before repair shown in FIG. 6 is not problematic because repair chip 3 is not mounted, in the configuration of the semiconductor memory module after repair shown in FIG. 7, bare chip 1 (D0) and repair chip 3 (D'0) utilize data input/output terminals DQ0 to DQ63 that are connected to common electrical wires 20 and, therefore, input/output signals of bare chip 1 (D0) and repair chip 3 (D'0), respectively, collide with each other, in the condition (activated condition) wherein both bare chip 1 (D0) and repair chip 3 (D'0) are in operation.

Therefore, in the semiconductor memory module of the present embodiment, the above described problems are solved by using the below described INB circuit.

Figure 8:
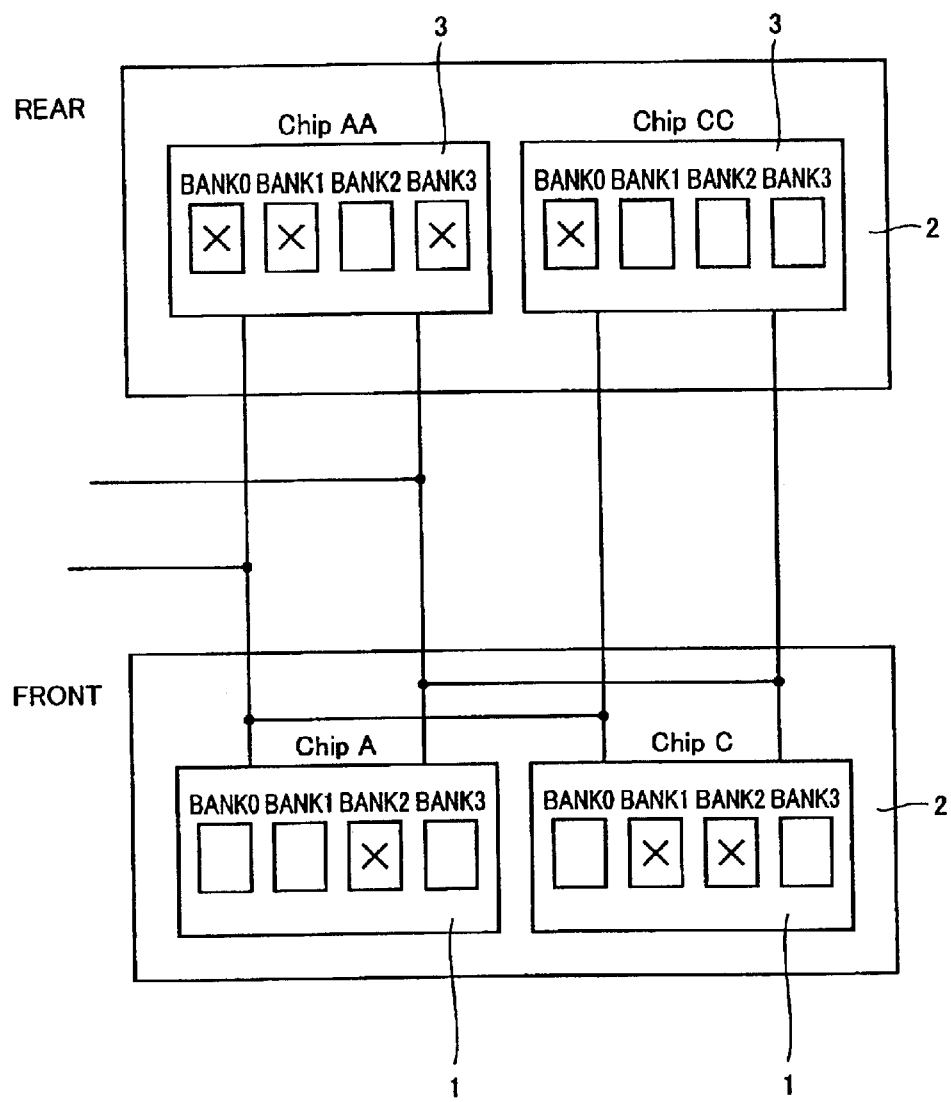
FIG. 8 is a diagram showing a condition wherein a semiconductor memory module is repaired using a partially good product mounted on the rear surface in the case that a portion of the banks of the chips has become defective in the semiconductor memory module of the present embodiment.

FIG. 8 shows a schematic configuration of a semiconductor memory module wherein two partially good products as repair chips 3 (chip AA and chip CC) mounted on the rear surface of module substrate 2 carry out the functions substituting for specific banks that have become defective of two bare chips 1 (chip A and chip C), respectively, mounted on the front surface of module substrate 2. Here, partially good products indicate semiconductor chips wherein any bank is a good product from among the plurality of banks, even though all banks of the plurality of banks are not good products but, rather, include a defective bank.

As shown in FIG. 8, BANK 2 of a bare chip 1 (chip A) and BANKs 1 and 2 of a bare chip 1 (chip C) mounted on the front surface have become defective in the semiconductor memory module of the present embodiment. In order to substitute for the functions of BANK 2 of bare chip 1 (chip A) and of BANKs 1 and 2 of bare chip 1 (chip C) that have become defective on the surface of this module substrate 2, a repair chip 3 (chip AA) wherein BANKs 0, 1 and 3 have become defective but wherein BANK 2 functions properly and a repair chip 3 (chip CC) wherein BANK 0 has become defective but wherein BANKs 1, 2 and 3 function properly are mounted on the rear surface of module substrate 2 in the semiconductor memory module of the present embodiment.

In this manner, a repair chip 3 for substituting for the functions of a specific bank that has become defective of a bare chip 1 mounted on the surface is mounted on the rear surface in the semiconductor memory module of the present embodiment so that the semiconductor memory module functions as a whole as if all bare chips are good products. In addition, the chip mounted on the rear surface is a chip that conventionally does not function as a single good product, that is to say, is a chip that is recognized as a defective product as a whole even though a portion of a good product remains. Therefore, according to the semiconductor memory module of the present embodiment, it becomes possible to repair the semiconductor memory module by effectively utilizing a single chip that is conventionally discarded as a defective product.

Figure 9:
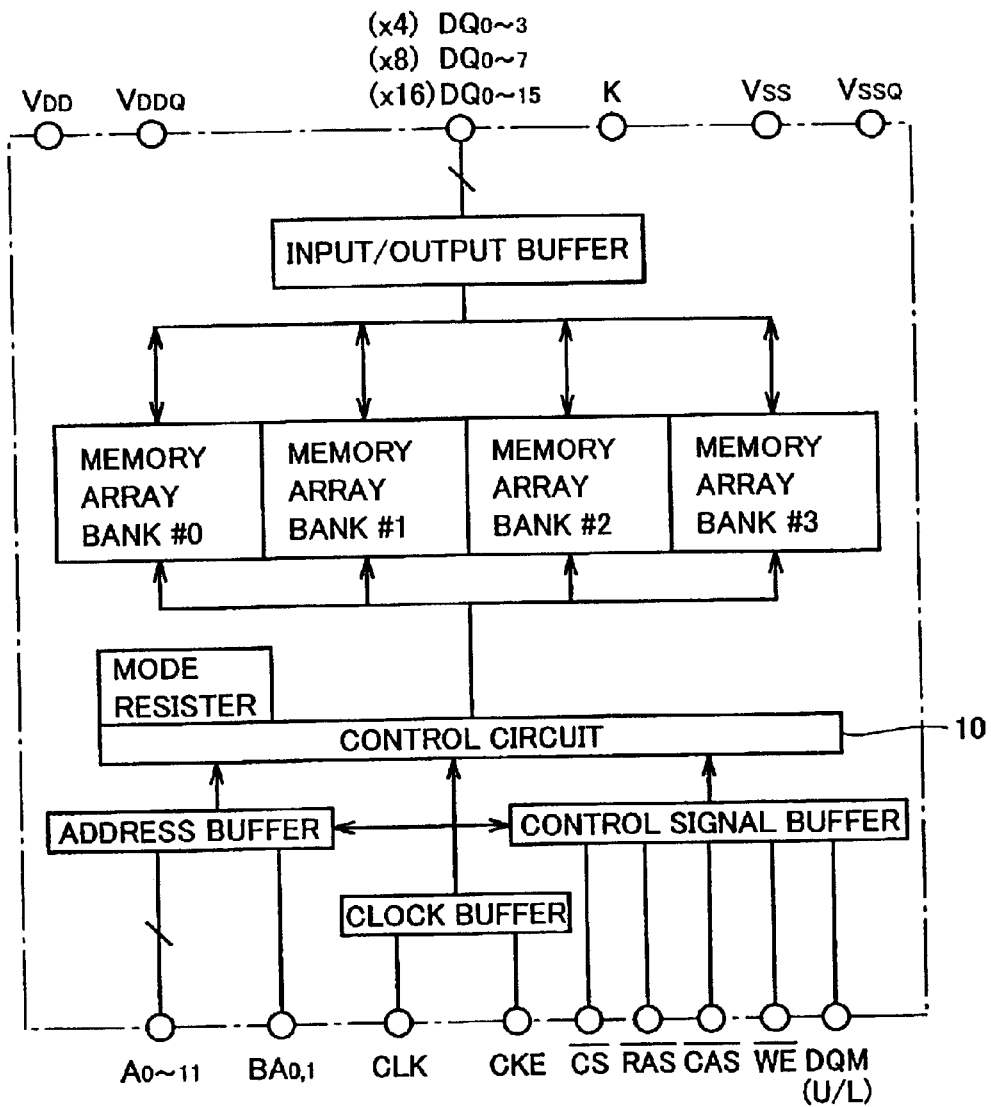
FIG. 9 is a diagram for describing a configuration of memory array banks inside of a bare chip used in the semiconductor memory module of the present embodiment.

FIG. 9 shows a block diagram for describing the internal configuration of bare chips 1 and of repair chips 3, respectively, used in FIG. 8. Here, in the semiconductor memory module of the present embodiment, bare chips 1 (chip A or chip C) and repair chips 3 (chip AA or chip CC) having the same internal configurations are used.

As shown in FIG. 9, bare chips 1 and repair chips 3, respectively, used in the semiconductor memory module of the present embodiment are provided with data input/output terminals DQ0 to DQ15 for carrying out input/output of data stored in banks and with address input terminals $A_0$ to $A_{11}$ into which address signals designating addresses within banks are inputted.

In addition, bare chips 1 and repair chips 3, respectively, are provided with bank address terminals BA0 and BA1, into which bank address signals for designating any bank out of four banks in which data is stored are inputted, a master clock terminal CLK, into which a clock signal is inputted, and a clock enabling terminal CKE, into which a clock enabling signal for permitting the input of a clock signal is inputted.

In addition, bare chips 1 and repair chips 3, respectively, are provided with /CS (chip select) terminals through which chip select signals indicating that data is stored in bare chips 1 and repair chips 3, respectively, are inputted. In addition, bare chips 1 and repair chips 3, respectively, are provided with row address strobe terminals /RAS, column address strobe terminals /CAS and write enabling terminals /WE so that a plurality of types of commands are inputted using these three terminals. In addition, bare chips 1 and repair chips 3, respectively, are provided with output disabling/ write mask terminals DQM (U/L).

In addition, bare chips 1 and repair chips 3, respectively, are provided with power supply terminals $V_{DD}$, power supply terminals $V_{DDQ}$ for output, ground terminals $V_{SS}$, ground terminals $V_{SSQ}$ for output and fuse blowing current input terminals K into which an excessive current is inputted in order to blow fuses provided inside of bare chips 1.

In addition, the insides of bare chips 1 and repair chips 3, respectively, are provided with four memory array banks #0 to #3, mode resistors, control circuits 10 for controlling write-in of data into memory banks according to external signals when the external signals are inputted, address buffers into which address signals are inputted from address terminals, control buffers into which control signals (commands) are inputted from /RAS terminals, /CAS terminals, /WE terminals and the like, and clock buffers into which signals associated with clock signals are inputted from CLK terminals and CKE terminals.

Figure 10:
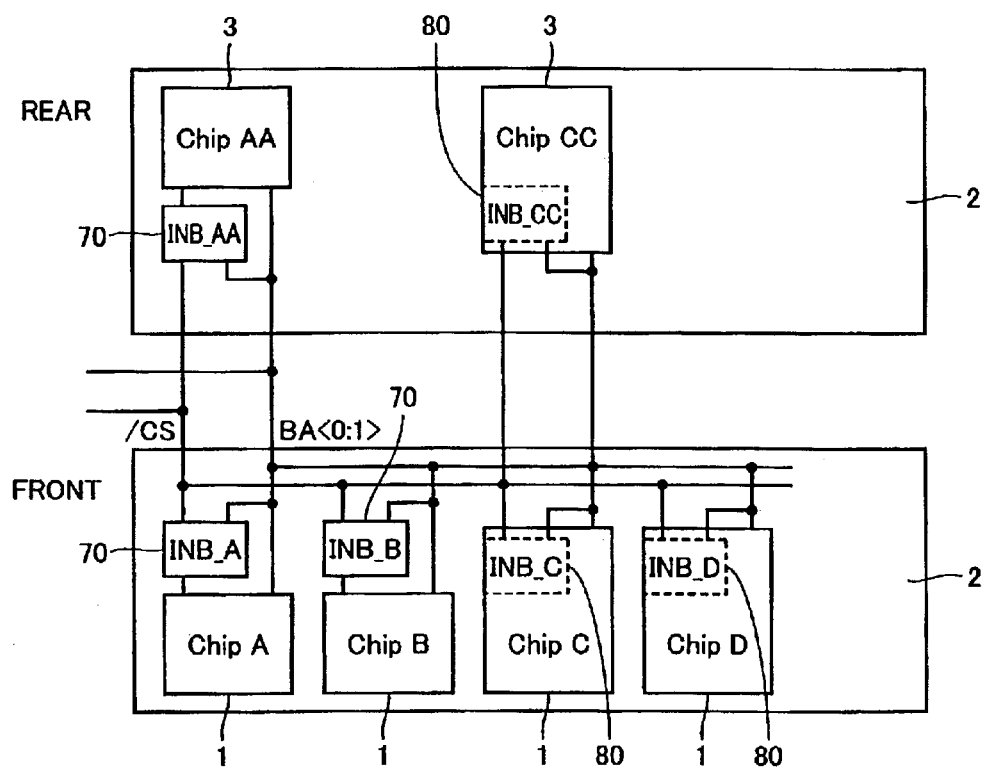
FIG. 10 is a diagram for describing a condition wherein INB circuits are provided inside of or outside of bare chips or repair chips used in the semiconductor memory module of the present embodiment.

FIG. 10 shows INB circuits used in the semiconductor memory module of the present embodiment. The INB circuits include INB circuits 70 provided inside of bare chips 1 and repair chips, respectively, and INB circuits 80 provided on the front or rear surface of module substrate 2 outside of bare chips 1 and repair chips 3, respectively.

In the semiconductor memory module of the present embodiment, in the case that any of four banks 0 to 3 existing inside of bare chips 1 (chip A and chip C) as well as repair chips 3 (chip AA and chip CC), respectively, is defective, it becomes possible for the functions of INB circuits 70 and 80 to prevent data from being inputted to the specific defective bank.

Here, the plurality of banks of repair chips 3, even though they are properly functioning banks, include, in some cases, banks that are controlled to be in the deactivated condition by INB circuits 70 and 80 in the case that the banks of bare chips 1 corresponding to the banks of repair chips 3 function properly. That is to say, in the semiconductor memory module of the present embodiment, it becomes possible for data to be prevented from being inputted to the banks that are not used to substitute for bare chips 1, though they are banks from among the plurality of banks of repair chips 3 that function properly, due to the functioning of INB circuits 70 and 80. Accordingly, it becomes possible to set the semiconductor memory module of the present embodiment so as to prevent the banks from among the plurality of banks of repair chips 3 that function properly from blocking the functions of the banks that function properly from among the plurality of banks of bare chips 1.

Figure 11:
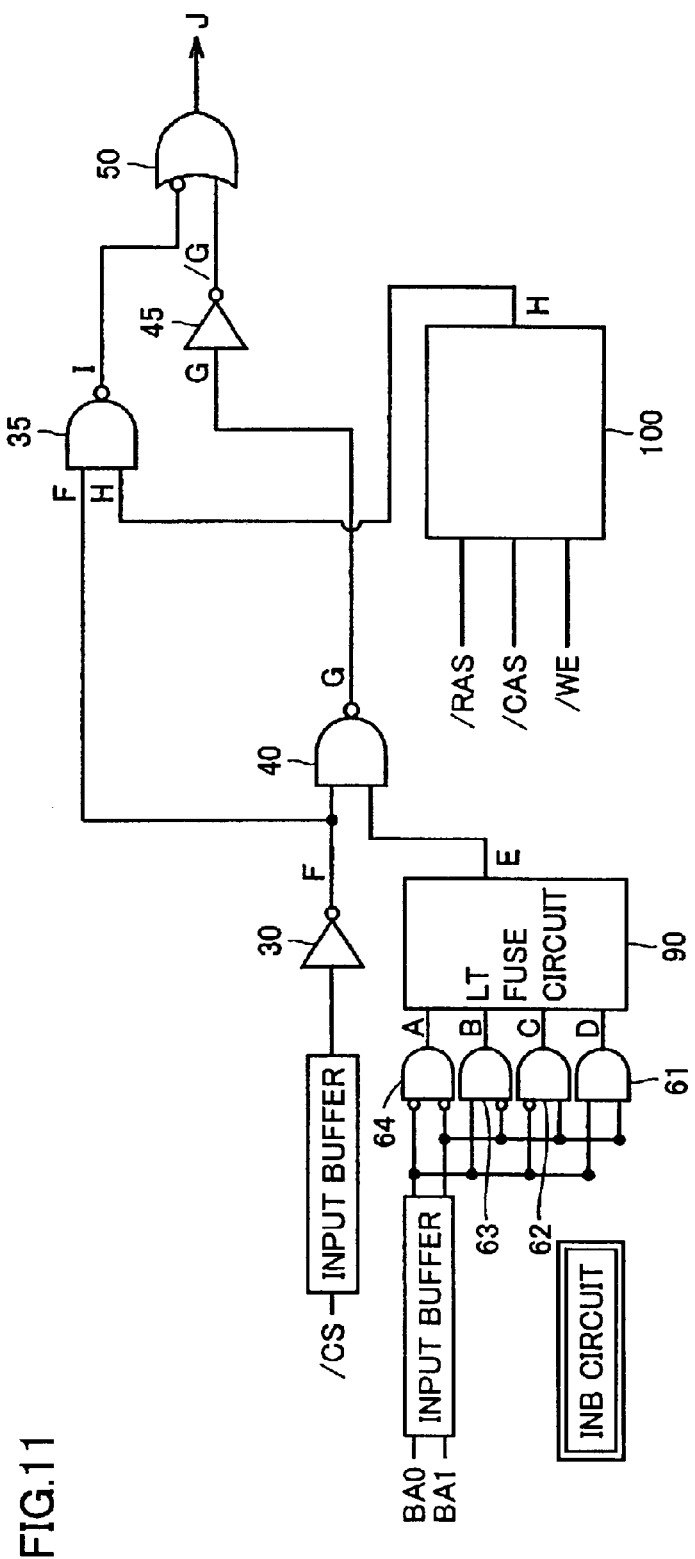
FIG. 11 is a diagram for describing an INB circuit.

In addition, the insides of INB circuits 70 and 80 are provided with fuse circuits 90 having fuses that can be blown by means of laser trimming, as shown in FIG. 11. These fuse circuits 90 are used so that the activated condition and the deactivated condition of a specific bank from among the four banks inside of the bare chip 1 and repair chip 3 can be switched. Here, the activated condition indicates the condition wherein data expected to be stored in a specific bank is allowed to be inputted to the specific bank and the deactivated condition indicates the condition wherein data expected to be stored in a specific bank is not allowed to be inputted to the specific bank.

FIG. 11 shows the internal configuration of an INB circuit. As FIG. 11 shows, the output terminal of the input buffer circuit to which /CS signal is inputted is connected to an input terminal of an inverter circuit 30. In addition, one of the input terminals of NAND circuit 40 is connected to an output terminal F of inverter circuit 30. In addition, bank address terminal BA0 and bank address terminal BA1, respectively, are connected to a blown fuse selection circuit via an input buffer circuit. This blown fuse selection circuit includes four AND circuits 61 to 64.

In addition, a signal that has been inputted to bank address terminal BA0 and a signal that has been inputted to bank address terminal BA1 are inputted to the two input terminals of AND circuit 61, respectively, while the conditions remain unchanged. In addition, a signal that has been inputted to bank address terminal BA0 is inverted and inputted and a signal that has been inputted to bank address terminal BA1 is inputted, while the condition remains unchanged, to the two input terminals of AND circuit 62.

In addition, a signal that has been inputted to bank address terminal BA1 is inverted and inputted and a signal that has been inputted to bank address terminal BA0 is inputted, while the condition remains unchanged, to the two input terminals of AND circuit 63. In addition, a signal that has been inputted to bank address terminal BA0 and a signal that has been inputted to bank address terminal BA1 are inverted and inputted to the two input terminals of AND circuit 64, respectively.

In addition, in the case that the respective output terminals of AND circuits 61 to 64 are posited as output terminal D, output terminal C, output terminal B and output terminal A, output terminals A to D, respectively, are connected to the four input terminals of fuse circuit 90, respectively.

In addition, output terminal E of fuse circuit 90 is connected to one of the input terminals of NAND circuit 40 so that a signal that has been outputted from output terminal E of fuse circuit 90 is inputted to NAND circuit 40 from one of the input terminals of NAND circuit 40 while the condition remains unchanged. In addition, an inverter circuit 45 is connected between output terminal G of NAND circuit 40 and one of the input terminals of OR circuit 50 so that a signal that has been outputted from output terminal G of NAND circuit 40 is inverted and inputted to one of the input terminals of OR circuit 50.

In addition, an output terminal H of a command input appropriateness determination circuit 100 and one of the input terminals of a NAND circuit 35 are connected to each other so that signals that have been inputted to the /RAS terminal, the /CAS terminal and the /WE terminal, respectively, are inputted to one of the input terminals of NAND circuit 35 from output terminal H through command input appropriateness determination circuit 100.

Output terminal F of inverter circuit 30 is connected to another input terminal of NAND circuit 35. Further, output terminal I of NAND circuit 35 is connected to another input terminal of OR circuit 50.

The signal that has been outputted from output terminal F and the signal that has been outputted from output terminal H are inputted into one input terminal and another input terminal of NAND circuit 35, respectively, as they are. In addition, the signal that has been outputted from output terminal I is inputted into OR circuit 50 with inverted condition.

Accordingly, in the case that one signal of either the signal outputted from output terminal H of command input appropriateness determination circuit 100 or the signal outputted from output terminal E of fuse circuit 90 is an activated condition indication signal that indicates that a bare chip 1 or a repair chip 3 is converted to an activated condition, bare chip 1 or repair chip 3 becomes of the activated condition.

Therefore, even in the case that output terminal E of fuse circuit 90 outputs a signal indicating that a bare chip 1 or a repair chip 3 is to be converted to the deactivated condition, bare chip 1 or repair chip 3 allows a command that has been transmitted from the outside to be inputted to the inside and is controlled to be in the controlled condition specified by the inputted command according to the timing wherein an activated condition indication signal is outputted from output terminal H of command input appropriateness determination circuit 100.

Figure 12:
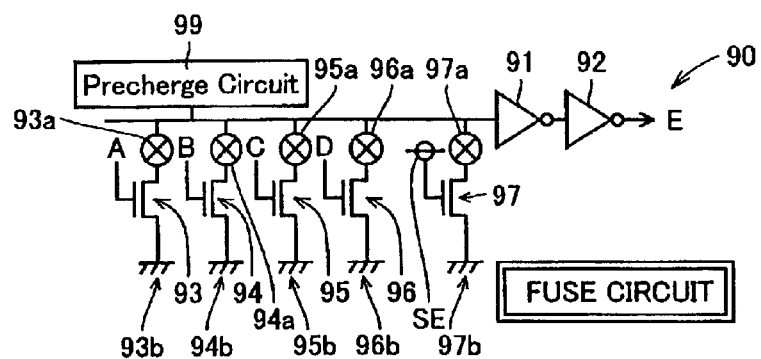
FIG. 12 is a diagram for describing a fuse circuit.

In addition, as shown in FIG. 12, output terminal A, output terminal B, output terminal C and output terminal D of AND circuits 61 to 64, shown in FIG. 11, respectively, are connected to the gate electrodes of transistors 93, 94, 95 and 96 inside of fuse circuit 90, and fuses 93a, 94a, 95a and 96a are connected to the source/drain electrodes of transistors 93, 94, 95 and 96, respectively.

In addition, a spare enabling terminal SE is connected to the gate electrode of transistor 97 and a fuse 97a is also connected to the source/drain electrode of transistor 97 in fuse circuit 90.

Here, transistors 93, 94, 95, 96 and 97, respectively, are the transistors that are turned ON, that is to say, the source electrodes and the drain electrodes are electrically connected, when current flows into the gate electrodes, that is to say, the gate electrodes become of the "H" condition.

Fuses 93a, 94a, 95a, 96a and 97a are fuses wherein whether or not they are blown is determined after the plurality of bare chips 1 are mounted on module substrate 2 and before mold resin 8 is applied.

In a manufacturing process for a semiconductor memory module of the present embodiment, an examination of whether or not any bank from among the plurality of banks of the plurality of bare chips 1, respectively, is defective is carried out. Selected fuses from among fuses 93a, 94a, 95a, 96a and 97a are blown by means of laser trimming so that only the good banks, other than the banks wherein defects have not been detected in the examination, become usable.

Accordingly, fuses corresponding to the banks wherein defects have not been detected are blown while fuses corresponding to the banks wherein defects have been detected remain in the condition wherein the fuses are not blown.

Here, as shown in FIG. 12, in the case that fuse 97a connected to the source/drain electrode of transistor 97, of which the gate electrode is connected to spare enabling terminal SE, is not blown, the input of a signal from spare enabling terminal SE turns ON transistor 97 so that current transmitted from a pre-charging circuit 99 can be made to flow to a ground electrode 97b.

Therefore, in the case that fuses 93a, 94a, 95a and 96a are all blown in fuse circuit 90, it is possible to input a predetermined signal from spare enabling terminal SE, thereby to attain a deactivated condition wherein data is not inputted to bare chips 1 or to repair chips 3 as long as fuse 97a is not blown. Accordingly, when a semiconductor memory module is utilized, a fuse corresponding to the bank utilized in the semiconductor memory module is blown from among fuses 93a, 94a, 95a and 96a and it is necessary to blow fuse 97a corresponding to spare enabling terminal SE.

In addition, the source/drain electrodes, to which fuses 93a, 94a, 95a, 96a and 97a of transistors 93, 94, 95, 96 and 97 are connected, are connected to pre-charging circuit 99.

In this fuse circuit 90, in the case that any transistor from among transistors 93, 94, 95, 96 and 97 is ON and the fuse connected to the source/drain electrode of the transistor that has been turned ON, from among fuses 93a, 94a, 95a, 96a and 97a is not blown, current flowing from pre-charging circuit 99 does not reach two inverter circuits 91 and 92 but, rather, flows to ground electrodes 93b, 94b, 95b, 96b and 97b.

However, in the case that any transistor from among transistors 93, 94, 95, 96 and 97 is ON and the fuse connected to the source/drain electrode of the transistor that has been turned ON, from among fuses 93a, 94a, 95a, 96a and 97a is blown, a signal outputted from pre-charging circuit 99 passes through two inverter circuits 91 and 92 and is outputted from output terminal E, shown in FIG. 11.

In other words, when the condition is attained wherein any fuse from among fuses 93a, 94a, 95a, 96a and 97a is blown, the signal outputted from pre-charging circuit 99 is outputted from output terminal E while maintaining the condition unchanged, regardless of whether or not the transistor wherein the blown fuse is connected to the source/drain electrode from among transistors 93, 94, 95, 96 and 97 has been turned ON.

Accordingly, in the case that any fuse is blown, the signal outputted to NAND circuit 40 does not change, even when a signal is inputted to the gate electrode of the transistor wherein the blown fuse from among fuses 93a, 94a, 95a and 96a is connected to the source/drain electrode. In other words, in the case that the inputted bank address is a bank address corresponding to the transistor wherein the fuse is blown, the output from pre-charging circuit 99 is outputted to the other input terminal of NAND circuit 40 without change.

As a result, in the case that a fuse corresponding to a bank that is desired to be utilized within one bare chip 1 or repair chip 3 is blown, a signal outputted from pre-charging circuit 99 is outputted while the condition is maintained unchanged even when a signal that designates the bank address of this bank is inputted so that a signal for activating a transistor is inputted to the gate electrode of the transistor wherein this fuse is connected to the source/drain electrode. Therefore, the signal that indicates that data is inputted to the bank corresponding to this blown fuse is outputted from output terminal G of NAND circuit 40.

Contrarily, a fuse corresponding to a bank that is not utilized within one bare chip 1 or repair chip 3 is not blown and, therefore, current outputted from pre-charging circuit 99 flows into gate electrodes corresponding to bank addresses from among gate electrodes 93b, 94b, 95b, 96b and 97b and does not flow into the other input terminal of NAND circuit 40 shown in FIG. 11 in the case that a signal that designates the bank address of this bank is inputted and a signal for activating a transistor is inputted to the gate electrode of the transistor wherein this fuse is connected to the source/drain electrode. Therefore, a signal that indicates that data is not inputted to the bank corresponding to this inputted bank address is outputted from output terminal G of NAND circuit 40.

Figure 13:
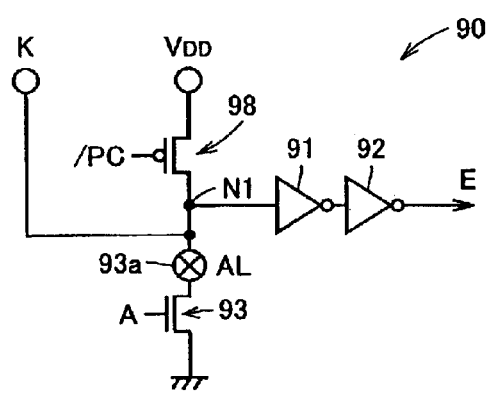
FIG. 13 is a diagram for more concretely describing a fuse circuit.

FIG. 13 shows a circuit diagram obtained by conceptually focusing on only one portion of the above described fuse circuit. FIG. 13 shows a configuration of transistor 93, having a gate electrode to which output terminal A is connected, and its periphery. Here, in the circuit diagram shown in FIG. 13, fuse 93a is not a laser trimming fuse utilized in the semiconductor memory module of the present embodiment but, rather, is an aluminum fuse so that the fuse circuit has a configuration wherein aluminum is blown by allowing an excessive current to be inputted from a fuse blowing current input terminal K.

When a fuse made of fuse blowing current input terminal K and aluminum is provided in this manner instead of a laser trimming fuse, it becomes possible to select a bank that provides the activated condition and a bank that provides the deactivated condition even in the case that a bank that becomes defective is detected, as a result of examination, after the internal chips forming bare chips 1 or repair chips 3 are covered with a mold resin.

Figure 14:
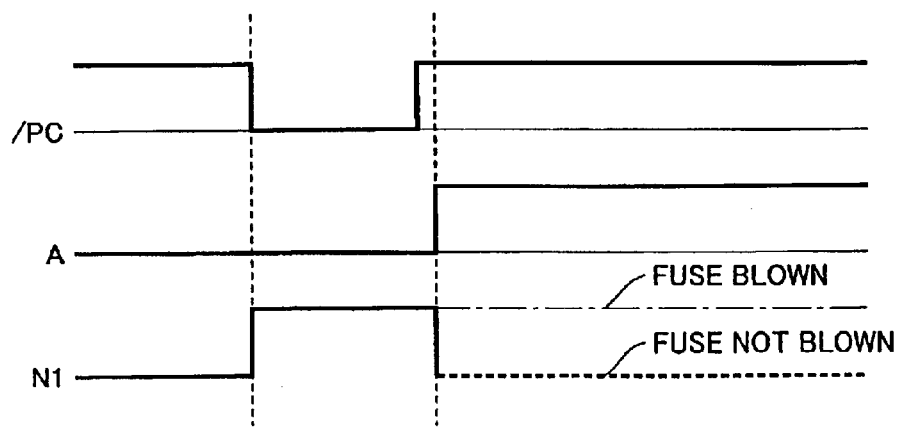
FIG. 14 is a graph for describing the timing according to which a signal inputted to the circuit shown in FIG. 13 and a signal outputted from the circuit shown in FIG. 13 are switched.

In addition, FIG. 14 shows a timing chart for describing the operation of fuse circuit 90, shown in FIG. 13. In fuse circuit 90, shown in FIG. 13, when a signal /PC transmitted from pre-charging circuit 99 becomes of the "L" condition, current from power supply terminal $V_{DD}$ turns ON transistor 98 so that signals outputted from node N1 and from output terminal E become of the "H" condition. Here, at this time, transistor 93 is not in the ON condition.

In addition, in the case that a signal is inputted to output terminal A under the above described condition so that transistor 93 is turned ON, a signal inputted to node N1 (output terminal E) from power supply terminal $V_{DD}$ is outputted while the condition is maintained unchanged when fuse 93a is blown. In addition, in the case that a signal is inputted to output terminal A so that transistor 93 is turned ON, output terminal E outputs a signal indicating that the ground potential is in the "L" condition when fuse 93a is not blown.

Accordingly, in the case that fuse 93a is blown, a signal transmitted from power supply terminal $V_{DD}$ is outputted from output terminal E while the condition is maintained unchanged regardless of the condition of the signal outputted from output terminal A. That is to say, in the case that fuse 93a is blown, a signal is outputted from output terminal E indicating that data transmitted from the outside is to be inputted to a bank. In addition, in the case that fuse 93a is not blown, it is selected whether or not a signal indicating that the data transmitted from outside is to be inputted to a bank is outputted depending on whether or not a signal is inputted to the gate electrode of transistor 93 concerning a signal outputted from output terminal E.

FIG. 15 shows a command table for describing a plurality of types of commands that are inputted to the respective terminals of bare chips 1 and repair chips 3 of the present embodiment.

It is necessary for specific commands from among the plurality of types of commands described in this command table to always be inputted to bare chips 1 and repair chips 3, respectively, regardless of the conditions of bare chips 1 and repair chips 3, respectively.

That is to say, the specific commands need to be inputted to bare chips 1 and repair chips 3, respectively, even according to the timing wherein, under the condition where a defect is detected in any bank from among the four banks and the fuse corresponding to the bank wherein the defect is detected remains without being blown so that the bank wherein the defect is detected becomes of the deactivated condition, the signal for specifying the bank address corresponding to this fuse is inputted to bare chips 1 and repair chips 3, respectively.

Described more concisely, the above described specific commands need to be inputted to bare chips 1 and repair chips 3, respectively, even according to the timing wherein a signal specifying the bank address designating the bank that has become of the deactivated condition is inputted to bank address terminals BA0 and BA1. In other words, the specific commands are commands wherein the condition of a signal outputted from the /CS terminal needs to be the condition that activates bare chips 1 or repair chips 3, regardless of the values of bank address BA <0, 1>.

This specific commands are commands of (2) non-operation, (5) pre-charge all banks, (10) auto-refresh, (11) self-refresh entry, (12) self-refresh exit and (13) mode resistor set, shown in FIG. 15.

In the case that the above described specific commands are inputted to bare chips 1 or repair chips 3, a signal outputted from output terminal H of command input appropriateness determination circuit 100 shown in FIG. 11 becomes a signal indicating that the above described commands are inputted into bare chips 1 or repair chips 3. As a result, a signal indicating that the commands are inputted into bare chips 1 or repair chips 3 is outputted from output terminal I to the inside of control circuit 10 shown in FIG. 9.

Figure 16:
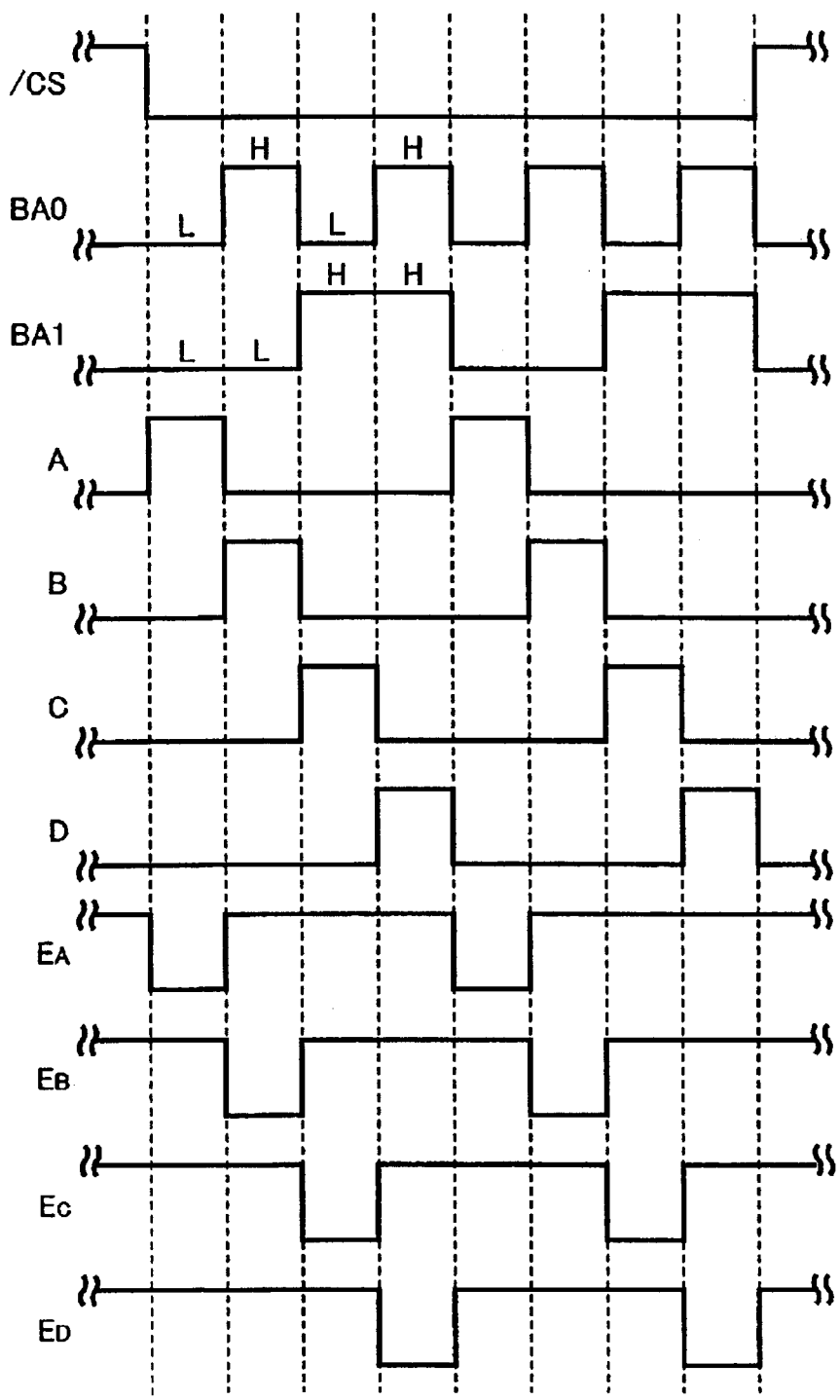
FIG. 16 is a timing chart for describing the timing according to which signals inputted into bank addresses and signals outputted from output terminals A, B, C, D and E, respectively, are switched.

The timing chart shown in FIG. 16 shows the switching timing of signals outputted from the above described /CS terminal, the BA0 terminal, the BA1 terminal, output terminal A, output terminal B, output terminal C, output terminal D and output terminal E, respectively.

Here, in FIG. 16, timing charts indicated by $E_A$, $E_B$, $E_C$ and $E_D$ show the switching timing of signals outputted from output terminal E in the case that a condition is posited wherein only the fuse corresponding to one output terminal from among output terminal A, output terminal B, output terminal C and output terminal D is not blown.

Figure 17:
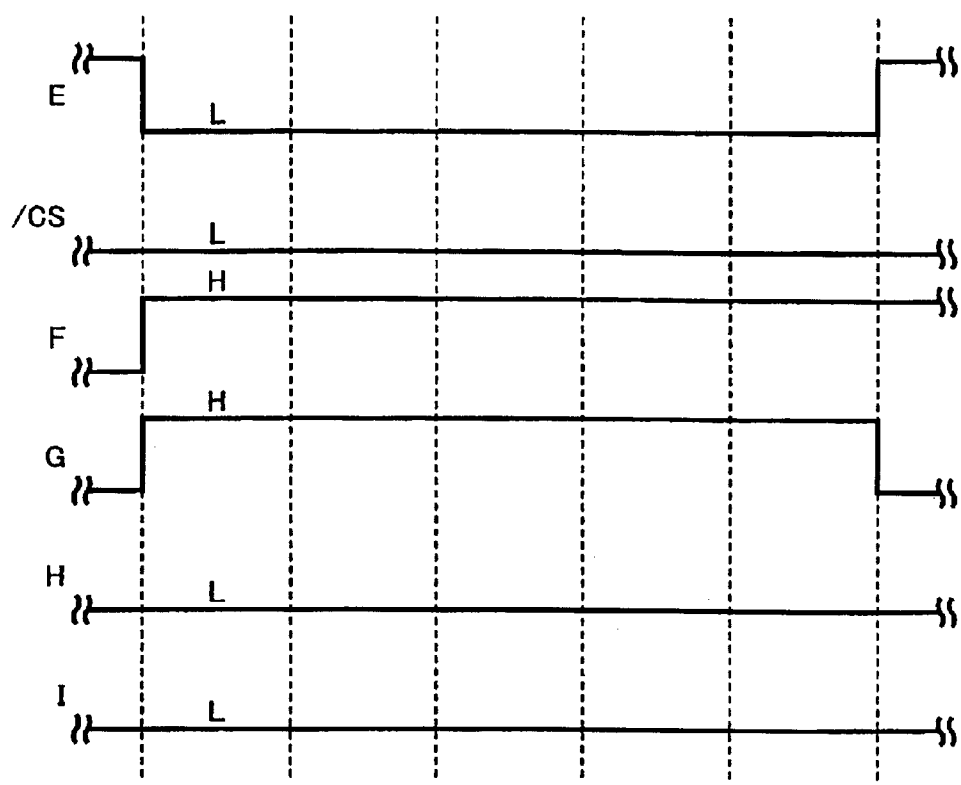
FIG. 17 is a timing chart for describing the timing according to which a signal inputted from a /CS terminal and signals outputted from output terminals E, F, G, H and I, respectively, are switched.

In addition, the timing charts shown in FIG. 17 indicate switching timings of signals outputted from E output terminal, the /CS terminal, output terminal F, output terminal G, output terminal H, output terminal I and output terminal J, respectively.

As shown in FIG. 16, the combinations of signals that are inputted to bank address terminals BA0 and BA1 are the following four: (L, L), (H, L), (L, H) and (H, H). A bank address is specified by one combination selected from among these four combinations. When a bank address signal specifying the bank address is inputted to bank address terminals BA0 and BA1, the condition of the signal outputted from the output terminal corresponding to the specified bank address from among output terminals A, B, C and D changes ("L"→"H").

In addition, in the case that the fuse corresponding to this specified bank address is not blown, the condition of the signal outputted from output terminal E changes ("H"→"L") together with the change ("L"→"H") in the condition of the signal outputted from output terminals A to D corresponding to this specified bank address.

This is because the fuse corresponding to the bank address is not blown and the transistor corresponding to the bank address within fuse circuit 90, shown in FIGS. 11 to 13, has been turned ON together with the input the signal that designates the bank address.

In addition, as shown in FIG. 17, a signal in the "H" condition is outputted from output terminal G of NAND circuit 40 shown in FIG. 11 while a signal in the "L" condition is outputted from an output terminal /G of inverter circuit 45 shown in FIG. 11, according to the timing wherein a signal outputted from output terminal E is in the "L" condition. Therefore, in the case that the signal outputted from output terminal H of the above described command input appropriateness determination circuit 100 is "L," since a signal in the "H" condition is outputted from output terminal I, a signal in the "L" condition is outputted from output terminal J of OR circuit 50.

As a result, bare chips 1 or repair chips 3 become of the deactivated condition wherein data transmitted from outside is not allowed to be inputted to a bank according to the timing wherein a signal specifying this bank address is inputted.

Here, in the case that all of fuses 93a, 94a, 95a and 96a are blown and fuse 97a is blown, that is to say, in the case that all the banks of bare chips 1 or repair chips 3 function properly, the signal outputted from output terminal E always becomes of the "H" condition. As a result, in the case that the signal inputted from the /CS terminal is "L," that is to say, in the case that a bare chip 1 or a repair chip 3 having this /CS terminal is selected to be utilized, the signal outputted from output terminal J of OR circuit 50 always becomes of the "H" condition. Thereby, when a signal designating a bank address is inputted, data transmitted from outside is always stored in the bank corresponding to this bank address.

Figure 18:
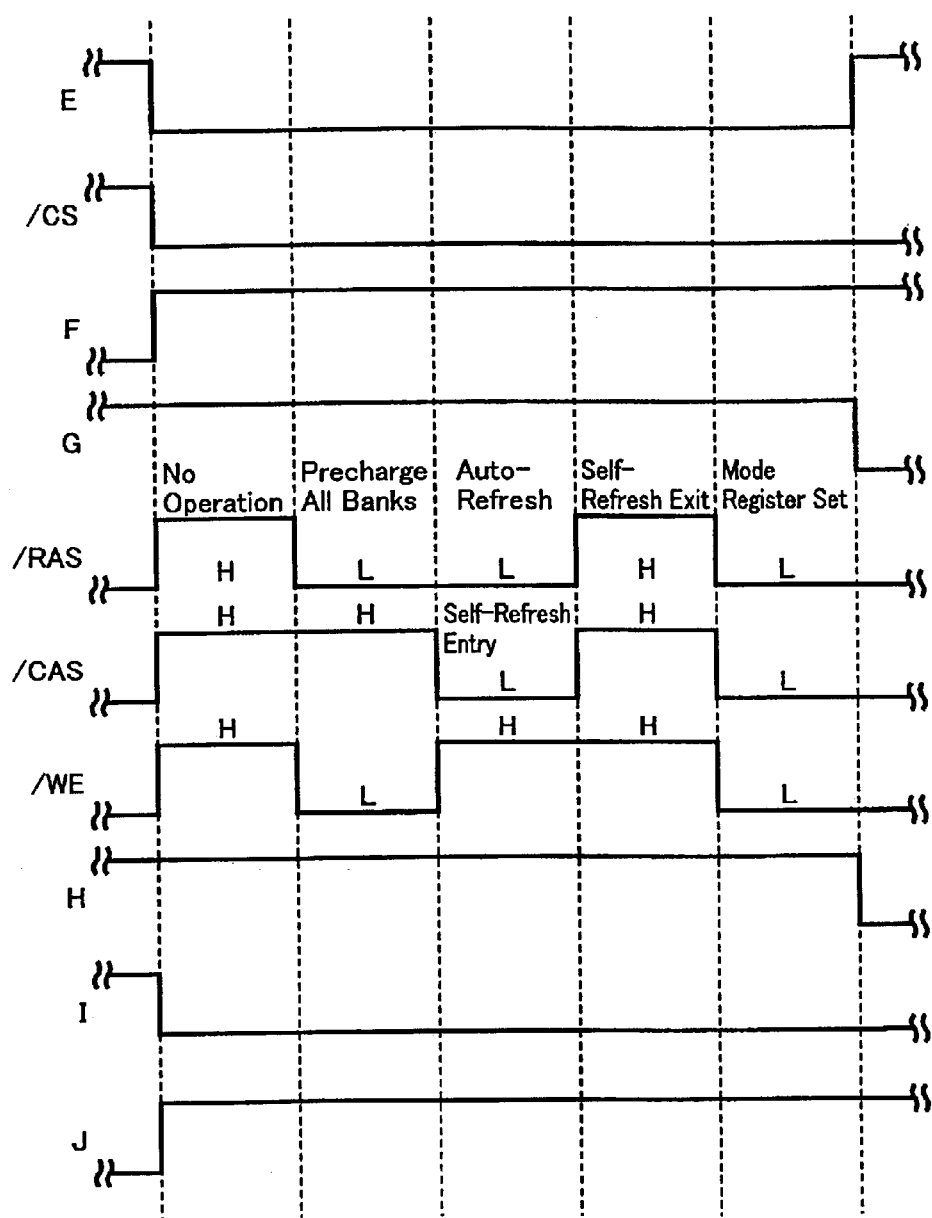
FIG. 18 is a logic chart for describing the logic according to which signals inputted from the /CS terminal, a /RAS terminal, a /CAS terminal and a /WE terminal and signals outputted from the output terminals E, F, G, H and I, respectively, are switched.
Figure 19:
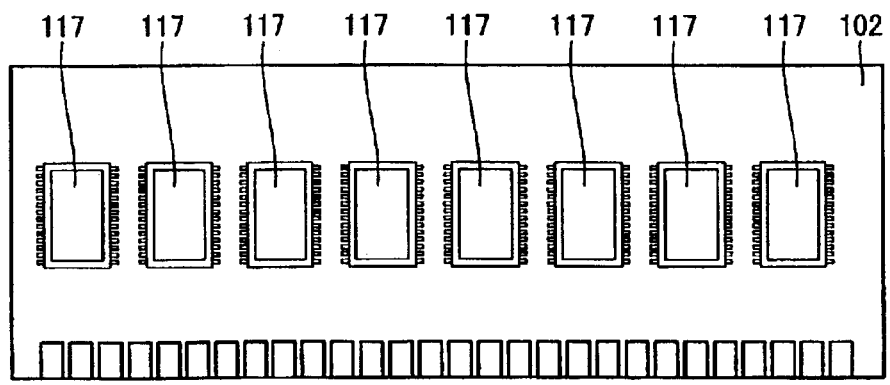
FIG. 19 is a view for describing a configuration seen from above of a semiconductor memory module according to a prior art.
Figure 20:
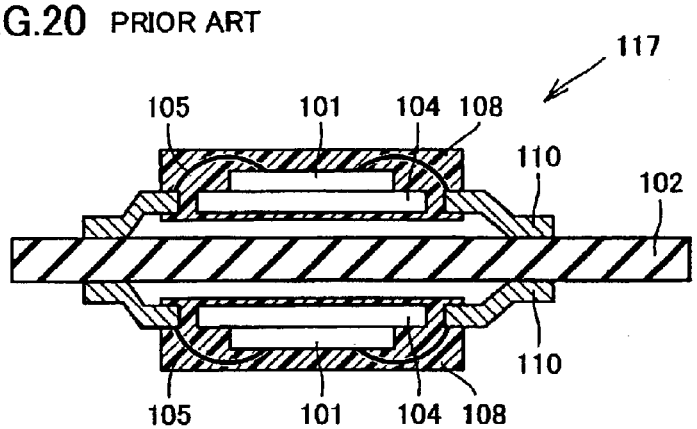
FIG. 20 is a view for describing a cross sectional configuration of the semiconductor memory module according to the prior art.

In addition, the logic charts shown in FIG. 18 indicate switching logic of signals outputted from output terminal E, the /CS terminal, the /RAS terminal, the /CAS terminal, the /WE terminal and output terminals F, G, H and J, respectively.

As is seen from FIG. 18, in the case that the commands indicated by (2) non-operation, (5) pre-charge all banks, (10) auto-refresh, (11) self-refresh entry, (12) self-refresh exit and (13) mode resistor set from among the specific commands shown in FIG. 15 are inputted into command input appropriateness determination circuit 100, that is to say, in the case that any combination of commands from among the combinations of (H, H, H), (L, H, L), (L, L, H), (H, H, H) and (L, L, L) is inputted to the three terminals of the /RAS terminal, the /CAS terminal and the /WE terminal, the signal outputted from output terminal H becomes of the "H" condition. As a result, even in the case that the signal outputted from the /CS terminal becomes of the "L" condition and the signal outputted from output terminal E becomes of the "L" condition, the signal outputted from output terminal J of OR circuit 50 becomes of the "H" condition.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory module comprising a module substrate and a semiconductor chip mounted on the module substrate, wherein said semiconductor chip includes
a plurality of banks that can store data, and
an address input terminal to which a bank specification signal is inputted that can specify in which of the plurality of banks the data is to be stored;

said semiconductor memory module further comprising
a specific bank activation/deactivation selection circuit provided inside or outside of said semiconductor chip, receiving said bank specification signal and being able to select whether manner or not to make a specific bank a deactivated condition, wherein, in said deactivated condition, data expected to be stored in the specific bank that is specified by the bank specification signal is not inputted to the specific bank when the bank specification signal is inputted.

2. The semiconductor memory module according to claim 1, further comprising
a substitute semiconductor chip for storing data expected to be stored in said specific bank in place of the specific bank in the case that said deactivated condition is obtained.

3. The semiconductor memory module according to claim 2, wherein
said substitute semiconductor chip has a plurality of banks so that banks other than the bank that is utilized in place of said specific bank from among the plurality of banks include a defective bank.

4. The semiconductor memory module according to claim 2, wherein
said substitute semiconductor chip includes
a plurality of substitute chip banks that can store data, and
an substitute chip address input terminal to which a substitute chip bank specification signal is inputted that can specify in which of the plurality of substitute chip banks the data is to be stored;

said semiconductor memory module further comprising a specific substitute chip bank activation/deactivation selection circuit provided inside or outside of said substitute semiconductor chip, receiving said substitute chip bank specification signal and being able to select whether manner or not make a specific substitute chip bank a deactivated condition, wherein, in said deactivated condition, data expected to be stored in the specific substitute chip bank that is specified by the bank specification signal is not inputted to the specific substitute chip bank when the substitute chip bank specification signal is inputted.

5. The semiconductor memory module according to claim 1, wherein said specific bank activation/deactivation selection circuit selects whether to make or not said specific bank said deactivated condition due to a fuse condition.

6. The semiconductor memory module according to claim 1, comprising a chip selection signal input terminal into which a chip selection signal for specifying whether or not data can be stored in said plurality of banks is inputted, wherein said specific bank activation/deactivation selection circuit can select whether make or not said specific bank said deactivated condition at the timing where said chip selection signal is in the condition that allows data to be stored in said plurality of banks.

7. The semiconductor memory module according to claim 1, comprising a specific command control enabling circuit that is a command input circuit to which a plurality of types of commands is inputted and that outputs, in the case that a specific type of command from among the plurality of types of commands is inputted, a signal for controlling said semiconductor chip to be in a controlled condition that is specified by said specific type of command regardless of whether or not said specific bank activation/deactivation selection circuit is in said specific bank deactivation condition.

* * * * *